United States Patent [19]
Wexler et al.

[11] Patent Number: 5,436,567
[45] Date of Patent: Jul. 25, 1995

[54] DOUBLE-SIDED AUTOMATIC TEST EQUIPMENT PROBE CLAMSHELL WITH VACUUM-ACTUATED BOTTOM PROBE CONTACTS AND MECHANICAL-ACTUATED TOP PROBE CONTACTS

[75] Inventors: Donald J. Wexler; Jeffrey L. Smith, both of San Jose, Calif.

[73] Assignee: Automated Test Engineering, Inc., San Jose, Calif.

[21] Appl. No.: 14,612

[22] Filed: Feb. 8, 1993

[51] Int. Cl.[6] .................... G01R 31/02; G01R 1/073
[52] U.S. Cl. ................................. 324/754; 324/761
[58] Field of Search ............... 324/158 P, 158 F, 72.5, 324/754, 761

[56]  References Cited
U.S. PATENT DOCUMENTS

| | | | |
|---|---|---|---|
| 3,701,021 | 10/1972 | Isaac et al. ...................... | 324/158 F |
| 3,970,934 | 7/1976 | Aksu .................................. | 324/761 |
| 4,101,830 | 7/1978 | Greig ................................ | 324/158 F |
| 4,225,819 | 9/1980 | Grau et al. ...................... | 324/158 F |
| 4,322,682 | 3/1982 | Schadwill ......................... | 324/158 F |
| 4,344,033 | 8/1982 | Stowers et al. ................... | 324/158 F |
| 4,352,061 | 9/1982 | Matrone ........................... | 324/158 F |
| 4,357,062 | 11/1982 | Everett ............................. | 339/18 R |
| 4,857,009 | 8/1989 | Christensen ...................... | 324/754 |

*Primary Examiner*—Ernest F. Karlsen
*Attorney, Agent, or Firm*—Thomas E. Schatzel

[57] ABSTRACT

A two-sided probe and clamshell fixture embodiment of the present invention comprises a vacuum-actuated bed-of-nails for probing the bottom side of a printed circuit board (PCB) device-under-test (DUT) and a pushrod-actuated bed-of-nails for probing the top side of the printed circuit board device-under-test. The fixture comprises a base, a bottom frame, and a bottom plate that are sealed for vacuum actuation by a gasket. When in place, the DUT completes the vacuum seal and the bottom bed-of-nails which includes a patterned array of spring loaded probe pins reaches through the bottom plate to contact probe points on the DUT. A set of push rods attached to the base push out through the bottom frame and operate a set of gear boxes attached to the outer edges of a top plate within a top frame. A patterned array of spring-loaded probe pins reaches through the top plate to contact probe points on the topside of DUT when a vacuum applied to the bottom assembly causes the pushrods to advance and operate the gear boxes. The gear boxes reverse the direction of force received to cause the topside pushrod-actuated bed-of-nails to engage the DUT.

6 Claims, 3 Drawing Sheets

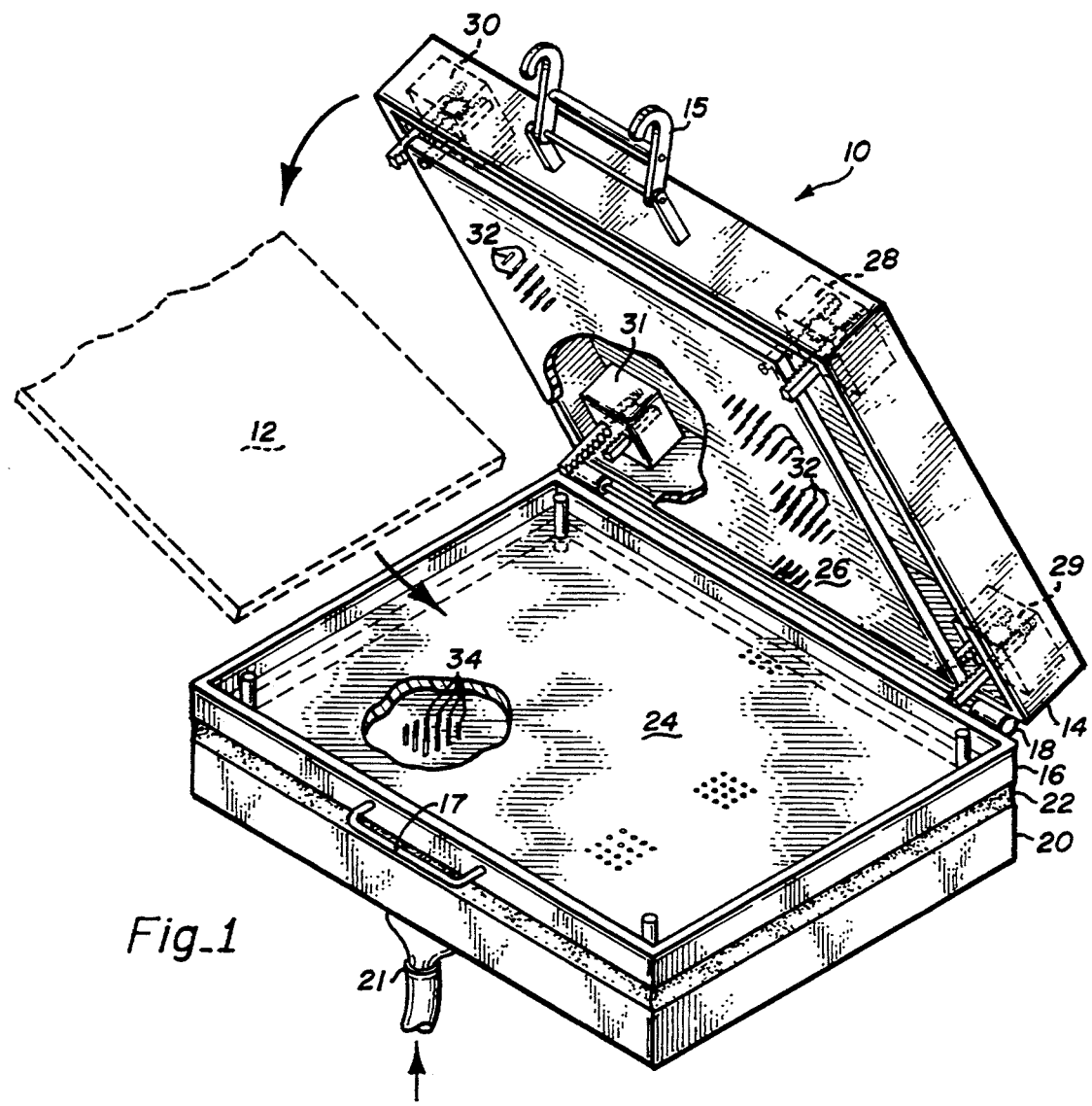
Fig_1
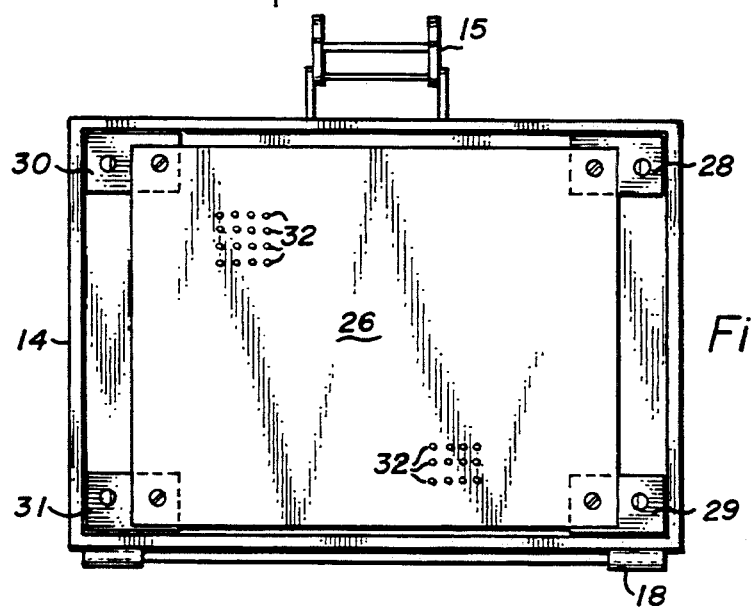
Fig_2

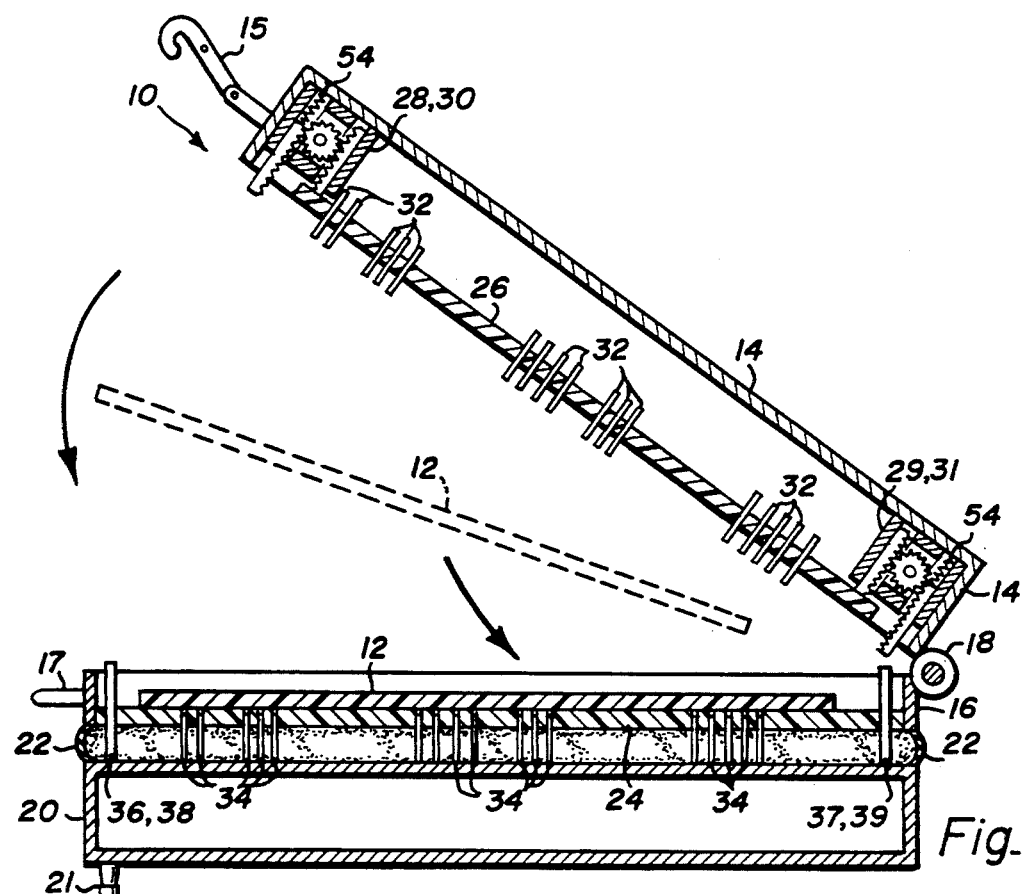
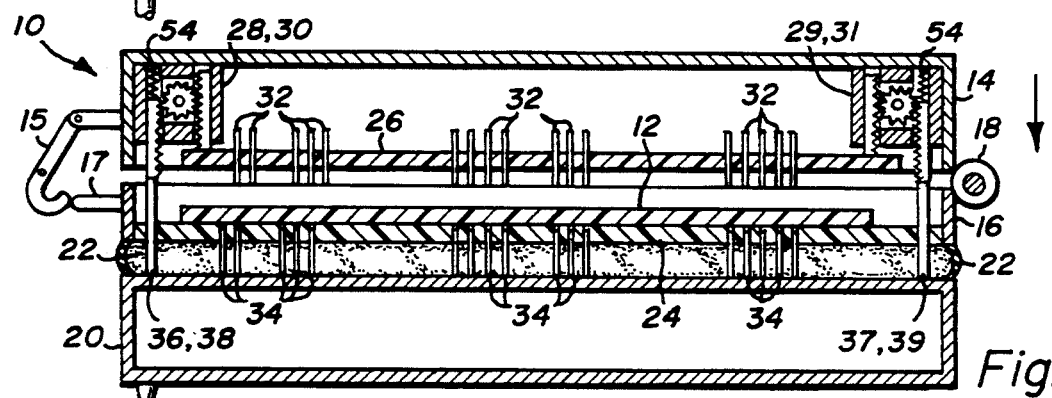
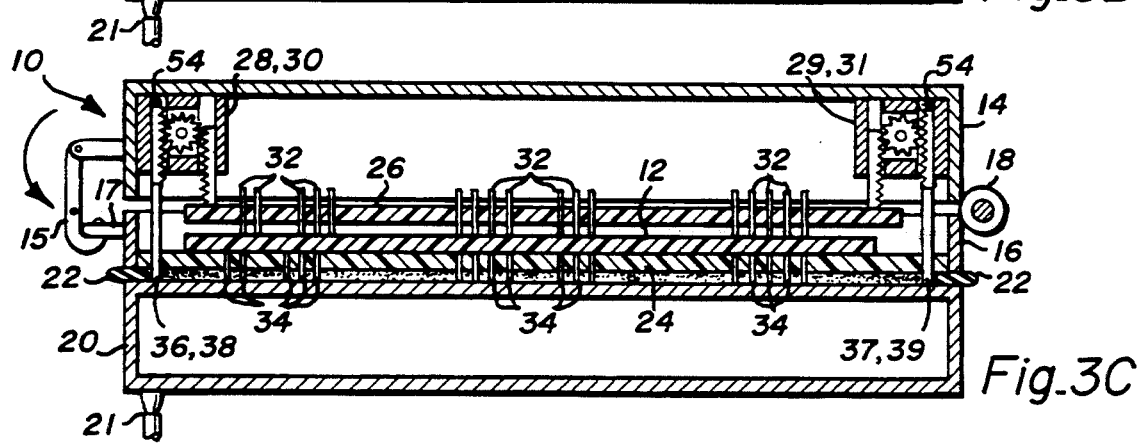
Fig. 3A
Fig. 3B
Fig. 3C

DOUBLE-SIDED AUTOMATIC TEST EQUIPMENT PROBE CLAMSHELL WITH VACUUM-ACTUATED BOTTOM PROBE CONTACTS AND MECHANICAL-ACTUATED TOP PROBE CONTACTS

BACKGROUND OF THE INVENTION

1. Field of the Invention

The present invention relates generally to automated loaded-board test probe fixture mechanisms, and more particularly to two-sided bed-of-nails clamshell probe fixtures.

2. Description of the Prior Art

The earliest printed circuit boards (PCBs) placed through-hole circuit devices on one side and had an interconnecting printed pattern of copper foil etched on the opposite side. Automated loaded-board testing was very simple because an array of spring-loaded probe pins, commonly known as a bed-of-nails, could be used to make certain strategic contacts with key points on the PCB. A low degree of circuit integration and a lack of crowding on early PCBs, together with the single sided construction, lasted for several years and the challenges presented to automated testing equipment (ATE) manufactures mainly involved signal simulation, interpretation and increasing microcomputer clock speeds.

A bed-of-nails test fixture is described by Everett in U.S. Pat. No. 4,357,062. A universal circuit board probe assembly is used to connect a variety of circuit board types to a diagnostic test probe fixture mechanism. The probe assembly is an integrated test probe fixture mechanism that includes a general purpose perforate platform with the holes in a uniform grid pattern. Opposing double-action movement floating connector pins are used with a removable backing plate that confronts the platform. A means for aligning the backing plate with the platform and circuit board test points is provided.

Vacuum fixtures have developed as a popular way to draw-down a PCB onto its matching bed-of-nails during a test. The use of vacuum permits an even and relatively non-stressful application of a large amount of force that can be needed, especially when the spring pressures of a hundred or more individual probes must be simultaneously overcome. For single-sided probing, vacuum fixtures allow topside access to a PCB, because a vacuum seal may usually be easily maintained.

In U.S. Pat. No. 4,344,033, Stowers, et al., describe a vacuum-actuated test fixture that has a yielding diaphragm assembly with a rigid frame and spring-loaded diaphragm base plate. A test fixture distributes downward atmospheric pressure evenly over the entire area of the board without localized stress concentrations. A captive removable diaphragm frame and quick-acting spring-loaded cam latches make a positive seal around the margins of the diaphragm assembly and along top and bottom edges. A plug-in vacuum adapter with manual valve provides for hook-up of a test fixture to a vacuum source. A lower base frame and patchboard allow interfacing of a test fixture with a receiver frame.

Surface mount devices (SMD) are now in common usage and each pin of an SMD cannot be expected to through-hole (via) to the PCB bottom. It therefore has become necessary to probe both sides of a PCB to gain access to what signals are available on an assembled PCB.

However, double-side probing vacuum fixtures obstruct access because a vacuum must be maintain on both sides of a PCB. Therefore, switches cannot be set, nor option jumpers changed, nor variable resistors adjusted while a PCB is being tested. Moreover, such double-sided vacuum fixtures are expensive to construct and slow down production times.

SUMMARY OF THE INVENTION

It is therefore an object of the present invention to provide a test probe fixture mechanism for simultaneous probing of both top and bottom sides of a printed circuit board device-under-test.

It is a further object of the present invention to provide a fixture for two-sided probing of a printed circuit board device-under-test and that engages both sides perpendicularly.

It is a further object of the present invention to provide a fixture for two-sided probing of a printed circuit board device-under-test that permits simple, non-vacuum penetration and access to a top side of the printed circuit board device-under-test.

Briefly, a two-sided probe and clamshell fixture embodiment of the present invention comprises a vacuum-actuated bed-of-nails for probing the bottom side of a printed circuit board (PCB) device-under-test (DUT) and a pushrod-actuated bed-of-nails for probing the top side of the printed circuit board device-under-test. The fixture comprises a base, a bottom frame, and a bottom plate that are sealed for vacuum actuation by an accordion, or other type gasket. When in place, the DUT completes the vacuum seal and the bottom bed-of-nails which includes a patterned array of spring loaded probe pins reaches through the bottom plate to contact probe points on the DUT. A set of four push rods attached to the base push out through the bottom frame and operate a set of four gear boxes attached to the four corners of a top plate within a top frame. A patterned array of spring-loaded probe pins reaches through the top plate to contact probe points on the topside of DUT when a vacuum applied to the bottom assembly causes the pushrods to advance and operate the gear boxes. The gear boxes reverse the direction of force received to cause the topside pushrod-actuated bed-of-nails to engage the DUT.

An advantage of the present invention is that a test probe fixture mechanism is provided that can be rapidly adapted for customized applications.

Another advantage of the present invention is that a test probe fixture mechanism is provided that can probe both top and bottom sides of a DUT.

An advantage of the present invention is that a test probe fixture mechanism is provided that engages both its top and bottom spring-loaded probes perpendicular to the DUT and therefore reduces the risk of bending or breaking those probes.

A further advantage of the present invention is that a test probe fixture mechanism is provided that allows simple access to the top of a DUT during a test without compromising a vacuum seal because no vacuum on top of the DUT is necessary.

These and other objects and advantages of the present invention will no doubt become obvious to those of ordinary skill in the art after having read the following detailed description of the preferred embodiment which is illustrated in the various drawing figures.

IN THE DRAWINGS

FIG. 1 is a perspective view of a clamshell fixture embodiment of the present invention that opens up to receive a printed circuit board for testing from the left side of the diagram;

FIG. 2 is a bottom view of the top hinged assembly such as may be viewed from the mouth of the open fixture of FIG. 1;

FIG. 3A is a cross-section diagram of the clamshell fixture embodiment of FIG. 1 with the top hinged assembly opened up to receive a printed circuit board for testing from the left side of the diagram;

FIG. 3B is a cross-section diagram of the clamshell fixture of FIG. 1 after being closed over the printed circuit board which is in place for testing;

FIG. 3C is a cross-section diagram of the clamshell fixture of FIG. 1 after being drawn down by vacuum such that a series of probes are forced into contact with both the top and bottom sides of the printed circuit board;

DETAILED DESCRIPTION OF THE PREFERRED EMBODIMENT

Figure 4A:
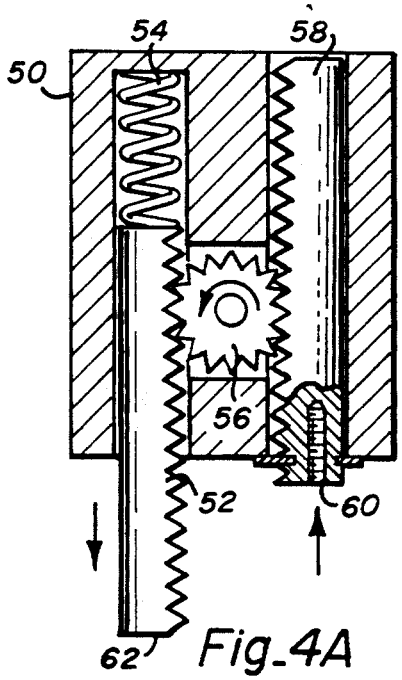
FIG. 4A is a cross-sectional view of a rack-and-pinion actuator for mounting in the top hinged assembly of the fixture of FIG. 1, and is shown in a relaxed condition.

FIG. 1 illustrates a clamshell fixture embodiment of the present invention, referred to by the general reference numeral 10, for two-sided probing of a device-under-test (DUT), such as a printed circuit board (PCB) 12. Fixture 10 forms a bed-of-nails test head for automatic test equipment (ATE) and in-circuit testing test probe fixture mechanisms. A top frame 14 with a latch 15 lifts open from a bottom frame 16 with a catch 17 and swings on a hinge 18. A base 20 is connected to an external vacuum test probe fixture mechanism with a vacuum port 21 and is joined to bottom frame 16 with a gasket 22. A bottom plate 24 supports PCB 12 and completes a vacuum seal. A top plate 26 is mounted at each of its four corners to a set of four rack-and-pinion actuators 28–31 (see also FIG. 2) mounted within top frame 14. Fewer than four actuators may be used if top plate 26 is reduced in size. Similarly, more than four actuators may be used if top plate 26 is enlarged in size.

A plurality of contact-pins 32 are mounted in top plate 26 and are provided for probing a top side of PCB 12 which faces top frame 14 when in place within fixture 10. A plurality of contact-pins 34 are nested in bottom plate 24 and are provided for probing a bottom side of PCB 12 which faces bottom frame 16 when in place within fixture 10. Contact-pins 34 are attached to base 20 such that they are able to slide back and forth through bottom plate 24, such as occurs when a vacuum is applied and bottom plate 16 and base 20 squeeze together compressing gasket 22. Contact pins 32 and 34 may be spring probes comprising phosphor bronze gold-plated tubing with gold-plated beryllium copper springs and contact plunger. Contact tips for the spring probes may be crown, pyramid, serrated, cup or pointed, depending on the application. A supplier of such spring probes that may be used for contact-pins 32 and 34 is Interconnect Devices, Inc. (Kansas City, Kans.). Another such acceptable supplier is QA Technology Company, Inc. (Hampton, N.H.).

FIGS. 3A, 3B and 3C illustrate set of four steel pushrods 36–39 that are attached to base 20 at its four corners such that they are able to slide back and forth through bottom plate 24 during vacuum actuation. Pushrods 36–39 are respectively positioned to engage and actuate rack-and-pinion actuators 28–31 when top frame 14 is closed on to bottom frame 16 and latched shut.

In operation, FIG. 3A illustrates fixture 10 in its open condition and receiving PCB 12. Bottom plate 24 allows PCB 12 to nestle in and seal such that a vacuum seal is completed within bottom frame 16, gasket 22 and base 20. Contact-pins 32 and 34 are respectively retracted into frames 14 and 16 and do not yet contact or interfere with the installation of PCB 12.

FIG. 3B illustrates fixture 10 in its closed condition after having received PCB 12. Contact-pins 32 and 34 are still retracted into frames 14 and 16 and have not yet contacted PCB 12. However, contact-pins 32 and 34 are now directly perpendicularly aligned to points on PCB 12 that will ultimately be contacted for electrical probing. Pushrods 36–39 are in mechanical contact with rack-and-pinion actuators 28–31 but have not yet applied pressure to any of them.

FIG. 3C illustrates fixture 10 in its vacuum actuated condition after having received PCB 12. Pushrods 36–39 advance and operate rack-and-pinion actuators 28–31 which causes top plate 26 to move down and out of top frame 14 and thus extend contact-pins 32. Therefore, contact-pins 32 and 34 are extended through frames 14 and 16 and contact predefined probe points on PCB 12. Because contact-pins 32 and 34 were directly aligned perpendicularly to the probe points on PCB 12 before engagement, contact-pins 32 and 34 are not subjected to forces that typically will bend or break the pins or that cause a misregistration.

FIG. 4A shows a rack-and-pinion actuator 50 which is exemplary of actuators 28–31 and that comprises a pushrod engagement rack gear 52, a compression spring 54, a pinion gear 56 and a top plate mounting rack gear 58. Actuator 50 is illustrated in its relaxed condition, meaning spring 54 has pushed rack gear 52 out of the body of actuator 50 to a limit. This, in turn, has caused pinion gear 56 to wind in rack gear 58 such that a mounting surface 60 is maximally retracted toward the body of actuator 50. A pushrod face 62 at the end of rack gear 52 is in its farthest out position.

Figure 4B:
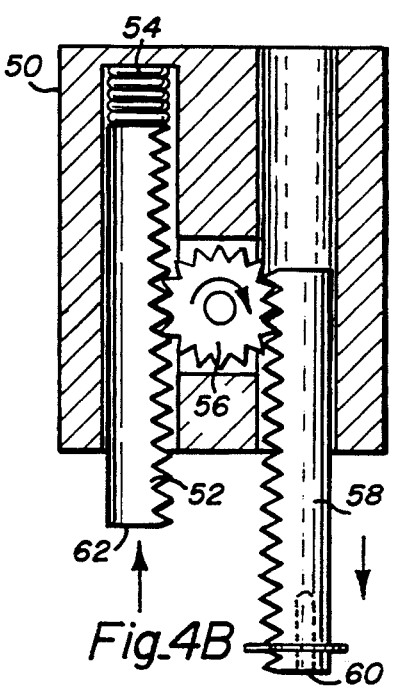
FIG. 4B is a cross-sectional view of the rack-and-pinion actuator of FIG. 4A and is shown in a compressed condition.

FIG. 4B illustrates actuator 50 in its compressed condition, which is caused by pushrod face 62 being forced in toward the body of actuator 50. Such force will occur when vacuum is applied to fixture 10, as is illustrated in FIG. 3C, and pushrods 36–39 advance toward actuators 28–31, respectively. The lifting action of surface 60 on top plate 26 will be proportional to the distance bottom frame 16 squeezes toward base 20 and compresses gasket 22 when vacuum is applied. Any gap that exists between pushrods 36–39 and actuators 28–31 in the position illustrated in FIG. 3B will subtract from the lifting action. Therefore, the reach of pushrods 36–39 above base 20 and the mounting positions of actuators 28–31 is critical. Pushrods 36–39 are preferably machine press-fit into base 20 and are not user adjustable.

Figure 5A:
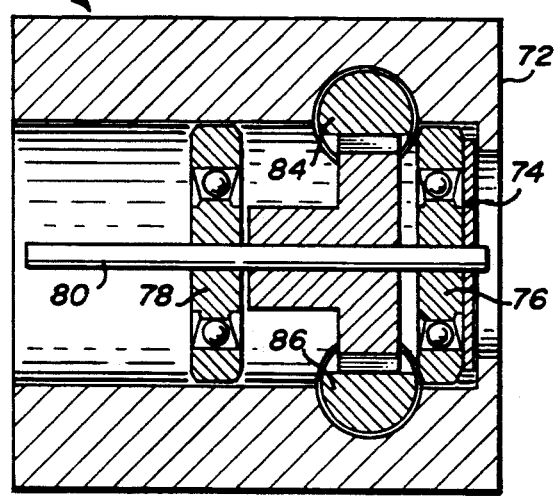
FIG. 5A is a cross-sectional diagram of an alternative embodiment of a gear box similar to the actuator of FIGS. 4A and 4B and taken along a plane perpendicular to its two parallel rack gears.
Figure 5B:
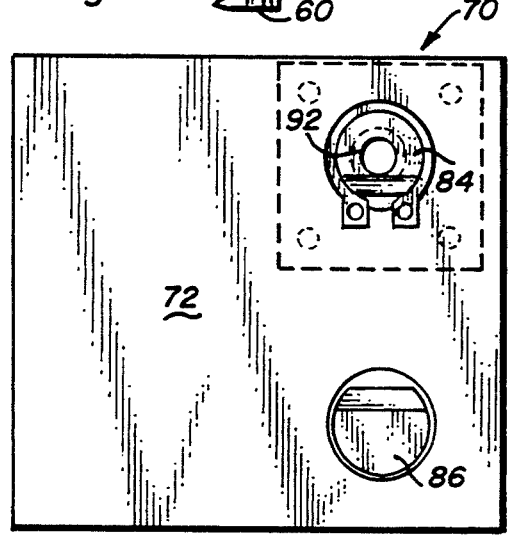
FIG. 5B is an end view of the gear box of FIG. 5A and has an orientation of that of FIG. 5A.

FIGS. 5A and 5B illustrate a gear box 70, which is an alternative embodiment of the actuators of the present invention, similar to actuator 50 (FIGS. 3A and 3B), and can be used in place of actuators 28–31 (FIGS. 3A–3C and 2). Gear box 70 comprises a gear box housing 72, a retaining ring 74, a pair of ball bearings 76 and 78, a bearing spindle 80, a pin hub 82, a pair of pitch racks 84 and 86, an external retaining ring 88, and a spring locker 90. Pitch racks 84 and 86 are equivalent to rack gears 58 and 52 (FIGS. 3A and 3B). Pin hub 82 is similar to pinion gear 56. A threaded machine screw hole 92 is on an end of pitch rack 84 equivalent to face 60 (FIGS. 3A and 3B). A fastener may be threaded into hole 92 to attach pitch rack 84, for example, to top plate 26 (FIGS. 1 and 2). Gear box 70 may be attached by its housing 72 with fasteners to top frame 14.

Figure 6A:
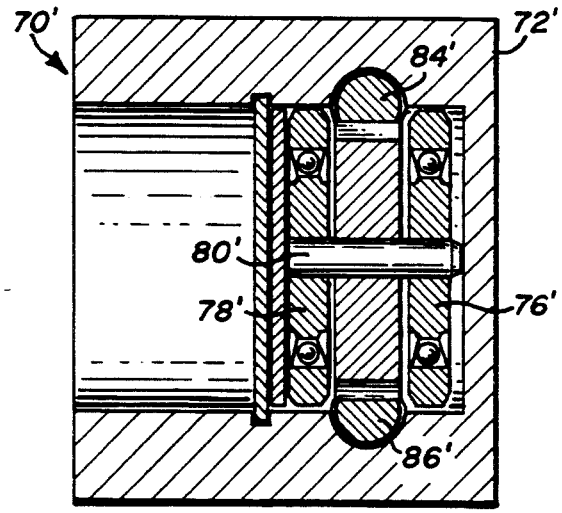
FIG. 6A is a cross-sectional diagram of an alternative embodiment of a gear box similar to the actuator of FIGS. 5A and 5B and taken along a plane perpendicular to its two parallel rack gears.
Figure 6B:
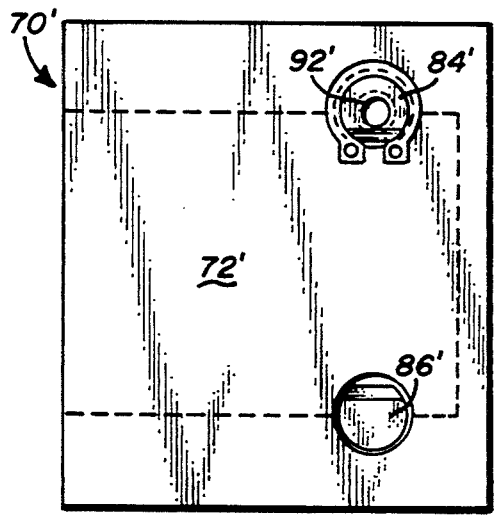
FIG. 6B is an end view of the gear box of FIG. 6A and has an orientation of that of FIG. 6A.

FIGS. 6A and 6B illustrate a gear box 70', which is an alternative embodiment of gear box 70, and so it and its elements that are similar to those of gear box 70 have the same element numbers, but with prime notation. Gear box 70' comprises a gear box housing 72', a pair of ball bearings 76' and 78', a bearing spindle 80', a pin hub 82', a pair of pitch racks 84' and 86' and an external retaining ring 88'. Pitch racks 84' and 86' are equivalent to rack gears 58 and 52 (FIGS. 3A and 3B). Pin hub 82' is similar to pinion gear 56. A threaded machine screw hole 92' is on an end of pitch rack 84' equivalent to face 60 (FIGS. 3A and 3B). A fastener may be threaded into hole 92' to attach pitch rack 84', for example, to top plate 26 (FIGS. 1 and 2). Gear box 70' may be attached by its housing 72' with fasteners to top frame 14.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A two-sided test probe mechanism, comprising:
a topside, door-mounted array of spring-loaded electrical probes for electrical connection with a first side of a device-under-test (DUT);
a bottom-side bed-of-nails test probe array for electrically contacting a plurality of testpoints on a second side of said DUT opposite to said first side;
compressing means mechanically articulated to the topside, doors mounted array of spring-loaded contacts and fixed to the bottom-side bed-of-nails test probe array for clamping said DUT within;
a lever mechanically connected to the compressing means and articulated to the array of spring-loaded electrical probes and having means for receiving a pushrod force of a first direction perpendicular to a plane including the array of spring-loaded electrical probes and for translating said pushrod force to drive said array of spring-loaded electrical probes independently articulated within the compressing means in a second direction opposite to said first direction and into perpendicular electrical contact with a plurality of testpoints on said first side of said DUT; and
vacuum-actuated means included within the compression means and connected to the bottom-side bed-of-nails test probe array for locking down said DUT during a test and for generating said pushrod force for driving the bottom-side bed-of-nails test probe array into electrical contact with said plurality of testpoints on said second side of said DUT.

2. The mechanism of claim 1, further comprising:
hinged-door means included within the compressing means for mounting the lever and the array of spring-loaded electrical probes and for allowing said DUT to be introduced for testing by opening the hinged door means and for holding said DUT substantially parallel to said plane during said testing by closing the hinged door means.

3. The mechanism of claim 1, further comprising:
pushrod force generation means mechanically connected to the vacuum-actuated means for converting a portion of said driving force in the vacuum-actuated means into said pushrod force in said first direction.

4. The mechanism of claim 1, wherein:
the lever comprises a first rack gear to receive said first direction pushrod force coupled to a pinion gear which, in turn, is coupled a second rack gear for output of said translated pushrod force in said second direction.

5. The mechanism of claim 4, wherein:
the lever further comprises a spring to counteract said pushrod force in said first direction such that said second rack gear may be retracted when there is an absence of said pushrod force.

6. The mechanism of claim 4, wherein:
the lever further comprises fastener means for supporting said array of spring-loaded electrical probes with said second rack gear.

* * * * *